United States Patent [19]

Hirata

[11] Patent Number: 4,716,132
[45] Date of Patent: Dec. 29, 1987

[54] METHOD OF MANUFACTURING A DISTRIBUTED FEEDBACK TYPE SEMICONDUCTOR DEVICE

[75] Inventor: Shoji Hirata, Kanagawa, Japan

[73] Assignee: Sony Corporation, Tokyo, Japan

[21] Appl. No.: 2,972

[22] Filed: Jan. 13, 1987

[30] Foreign Application Priority Data

Jan. 14, 1986 [JP] Japan ................................ 61-5725

[51] Int. Cl.$^4$ .......................................... H01L 21/208
[52] U.S. Cl. ................................... 437/228; 437/129; 372/96; 156/652; 156/656; 357/17
[58] Field of Search .............. 29/569 L, 580; 148/187, 148/175, DIG. 95, 1.5; 156/647, 652, 656, 653, 657; 357/16, 17; 372/96

[56] References Cited

U.S. PATENT DOCUMENTS 4,023,993 5/1977 Scifres et al. ...................... 372/96
4,178,604 12/1979 Nakamura et al. ............... 29/569 L
4,561,915 12/1985 Mito ................................. 29/569 L

FOREIGN PATENT DOCUMENTS 0117051 8/1984 European Pat. Off. .
0046083 3/1984 Japan .................................. 372/96

Primary Examiner—Brian E. Hearn
Assistant Examiner—Kevin McAndrews
Attorney, Agent, or Firm—Hill, Van Santen, Steadman & Simpson

[57] ABSTRACT

A method of manufacturing a distributed feedback type semiconductor laser comprises a first cladding layer, an active layer disposed on the first cladding layer, a guiding layer disposed on the active layer and a second cladding layer disposed on the guiding layer respectively, in which a grating is disposed on the guiding layer, wherein the method comprises, a step of forming a predetermined material layer on the guiding layer, a step of selectively etching the material layer and the guiding layer until the guiding layer is at least partially exposed thereby forming undulation substantially in a trigonal waveform to the surface of the material layer and the guiding layer, and a step of forming the second cladding layer so as to cover the unevenness. A distributed feedback type semiconductor laser having a grating with an intense coupling the light can be manufactured easily and at a good reproducibility.

2 Claims, 6 Drawing Figures

METHOD OF MANUFACTURING A DISTRIBUTED FEEDBACK TYPE SEMICONDUCTOR DEVICE

BACKGROUND OF THE INVENTION

1. Field of the Invention

This invention concerns a method of manufacturing a distributed feedback type semiconductor laser, which is most suitable to the use of manufacturing a distributed feedback type semiconductor laser with an intense coupling between light and grating.

2. Description of the Prior Art

A distributed feedback semiconductor laser (hereinafter referred to as a DFB laser) has been viewed as a laser capable of realizing a single longitudinal mode oscillation.

In the DFB laser, primary or secondary grating has been used thus far in which undulations are formed uniformly as a grating (diffraction lattice) for distributingly feeding back light in accordance with Bragg's reflection.

Referring to the primary grating of such devices, although an effective distributed feedback can be obtained due to intense coupling with the light, the device cannot be manufactured easily or with desired reproducibility.

Further, in the secondary grating in which the primary Fourier's component is 0 due to the shape, as shown in FIG. 3, since the amount of coupling with the light is small as an absolute value as compared with that of the primary grating and, in addition, the intensity of the coupling is sensitively dependent on the shape of the grating, the coupling, may be reduced to 0 depending on the case. Accordingly, it is difficult to obtain a stable oscillation with a sufficient strength in a DFB laser using the secondary grating as shown in FIG. 3.

However, it has been confirmed theoretically and experimentally that a sufficient coupling can be obtained as the DFB laser (coupling coefficient of greater than 100 $cm^{-1}$) by using the secondary grating of a shape as shown in FIG. 4, in which the primary Fourier's component is maximized. Accordingly, it is desired to provide a technique for manufacturing a secondary grating of the shape as shown in FIG. 4 uniformly and at a good reproducibility.

However, in the holographic exposure method which is a typical means for manufacturing a grating at a pitch A of about from 0.1 to 0.4 $\mu m$, it is almost impossible to manufacture the grating as shown in FIG. 4 because of the distribution in the exposure intensity inherent in to the means. On the other hand, it is possible to manufacture the shape as shown in FIG. 3 in a self-aligned manner at a good reproducibility so long as the distribution of the exposure intensity is within a certain extent, because of the anisotropy (crystal face dependency) possesses by a semiconductor substrate and an etching solution.

Further, since an electron beam exposure method can be employed if A<0.4 $\mu m$, it is possible to manufacture a secondary grating of the shape as shown in FIG. 4 with good reproducibility. However, it is impossible to use such a method for the DFB laser with the wave length at the vicinity of 850 nm since the pitch for the secondary grating is of about 0.25 $\mu m$.

The object of this invention is to provide an improved method of manufacturing a distributed feedback type semiconductor laser without the above noted drawbacks in the prior art.

SUMMARY OF THE INVENTION

The foregoing object can be attained in accordance with this invention by a method of manufacturing a distributed feedback type semiconductor laser comprising a first cladding layer 2 (for example n-$Al_{0.3}Ga_{0.7}As$), an active layer 3 (for example, GaAs) disposed on the first clad layer, a guiding layer 4 for example, p-$Al_{0.15}Ga_{0.85}$. As disposed on the active layer and a second cladding layer 7 (for example, p-$Al_{0.3}Ga_{0.7}As$) disposed on the guide layer respectively, in which a grating (for example, secondary grating 8) is disposed on the guiding layer, wherein the method comprises the steps of forming a predetermined material layer 5 (for example, p-$Al_{0.3}Ga_{0.7}As$) on the guiding layer 4, selectively etching the material layer 5 and the guiding layer 4 until the guiding layer 4 is at least partially exposed thereby forming undulation substantially of a trigonal waveform (for example, trigonal waveform undulation generally indicated at 6) to the surface of the material layer 5 and the guide layer 4, and forming the cladding layer 7 so as to cover the unevenness.

DESCRIPTION OF THE ACCOMPANYING DRAWINGS

These and other objects, as well as advantageous features of this invention will become apparent from the description of preferred embodiments of the invention, while referring to the accompanying drawings, wherein FIGS. 1A–1C are cross-sectional views illustrating the method of manufacturing a DFB laser in one embodiment according to this invention in the order of the steps;

DESCRIPTION OF PREFERRED EMBODIMENTS OF THE INVENTION

Figure 1A:
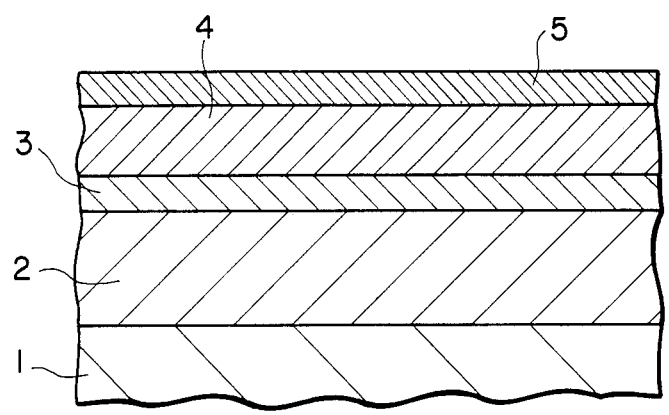

This invention will now be described referring to the drawings in which the invention is applied to the manufacture of an Al GaAs/GaAS hetero structured DFB laser.

As shown in FIG. 1A, n-$Al_{0.3}Ga_{0.7}As$ layer 2 constituting a first cladding layer, GaAs layer 3 constituting an active layer, p-$Al_{0.15}Ga_{0.85}As$ layer 4, constituting the guiding layer and p-$Al_{0.3}Ga_{0.7}As$ layer 5, are epitaxially grown successively on n-GaAs substrate 1 by means of MBE method or MOCVD method. The thickness of p-$Al_{0.3}Ga_{0.7}As$ layer 5 is selected to be about one-half of the height for the undulation 6 described later.

Figure 1B:
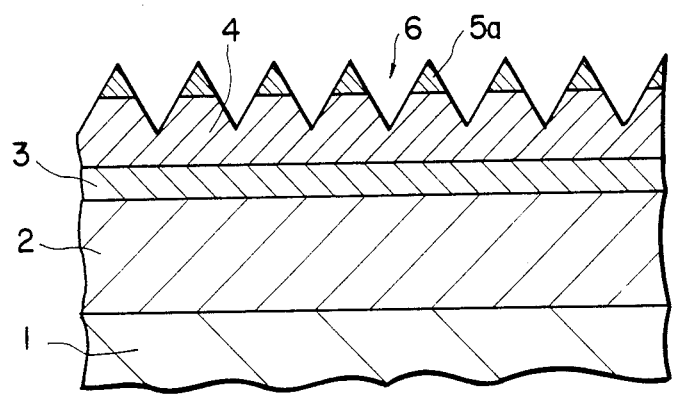
Figure 3:
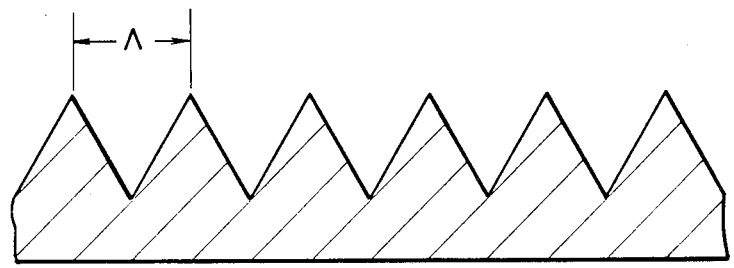
FIG. 3 is a cross-sectional view for a secondary grating, in which the primary Fourier's component is 0.

Then, by using the same method as that already described as used for preparing the secondary grating shown in FIG. 3 (method of utilizing the self-aligning property of etching), the p-$Al_{0.3}Ga_{0.7}As$ layer 5 and the p-$Al_{0.15}Ga_{0.85}As$ layer 4 are selectively etched until the p-$Al_{0.15}Ga_{0.85}As$ layer 4 is partially exposed and, further, to about the same depth as the thickness of the p-$Al_{0.3}Ga_{0.7}As$ layer 5, thereby forming a trigonal waveform undulation 6 along the interface between the p-$Al_{0.3}Ga_{0.7}As$ layer 5 and the p-$Al_{0.15}Ga_{0.85}As$ layer 4, as the center line, as shown in FIG. 1B.

Figure 1C:
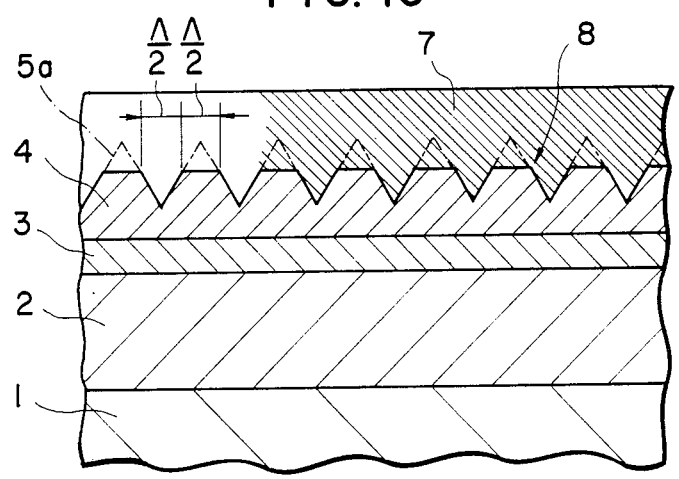
Figure 4:
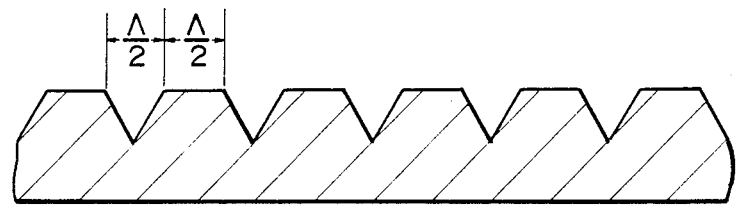
FIG. 4 is a cross-sectional view of a secondary grating in which the primary Fourier's component is maximum.

Then, p-Al$_{0.3}$Ga$_{0.7}$As layer 7 is epitaxially grown so as to cover the undulation 6 as shown in FIG. 1C by the MBE method or MOCVD method again to complete an aimed DFB laser incorporated with secondary grating 8 substantially in the identical shape with that of the seconary grating as shown in FIG. 4. The second cladding layer is constituted with the p-Al$_{0.3}$Ga$_{0.7}$As layer 7 as described above and the p-Al$_{0.3}$Ga$_{0.7}$As layer 5a (shown by the dotted line in FIG. 1c) of a trigonal cross-section left in the etching as described above.

In accordance with the example, as described above, substantial improvement is obtained. Since the trigonal waveform undulation 6 shown in FIG. 1B can be formed uniformly and at a good reproducibility, even with the conventional method, the secondary grating 8 finally obtained also has a favorable uniformity and reproducibility in the shape. Further, while the height for the trigonal waveform undulation 6 can be controlled by the film thickness for the Al$_{0.3}$Ga$_{0.7}$As layer 5, since the MBE method or MOCVD method capable of finely controlling the film thickness is used in the foregoing example, control for the height of the undulation in the finally obtained secondary grating 8 is also favorable. Accordingly, in the foregoing example, it is possible to manufacture a DFB laser having the secondary grating 8 with the primary Fourier's component at the maximum and having an intense coupling with the light, easily and with good reproducibility.

Although this invention has been described referring to one embodiment, the invention is no way limited only to the foregoing embodiment but various modifications are possible based on the technical idea of this invention. For example, it is possible to remove the p-Al$_{0.3}$Ga$_{0.7}$As layer 5a after forming the trigonal waveform undulation 6 and then epitaxially growing the p-Al$_{0.3}$Ga$_{0.7}$As layer 7.

Further, although the p-Al$_{0.3}$Ga$_{0.7}$As layer 5 is formed on the p-Al$_{0.15}$Ga$_{0.85}$As layer 4 for constituting the guiding layer in the foregoing embodiment, other material guiding layers may be used instead of the p-Al$_{0.3}$Ga$_{0.7}$As layer 5 so long as they consist of material capable of forming the trigonal waveform undulation 6 as shown in FIG. 1 by etching and, for instance, AlGaAs layers of different Al compositions may be used.

Figure 2:
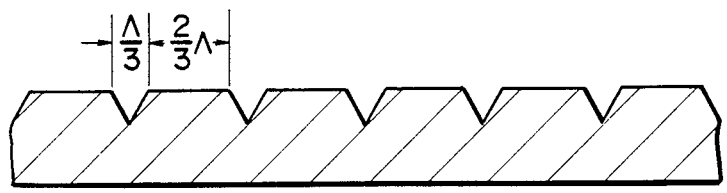
FIG. 2 is a cross-sectional view for a tertiary grating.

Furthermore, although this invention is applied in the case of forming the secondary grating 8 illustrated in the foregoing example, the invention is also applicable to the case of forming a third grating, for example, as shown in FIG. 2 grating, or higher order grating. In addition, this invention is also applicable to DFB lasers other than AlGaAs/GaAS hetero-structures.

According to this invention, it is possible to manufacture a distributed feedback type semiconductor laser having a grating with an intense coupling the light easily and at a good reproducibility.

I claim as my Invention:

1. A method of manufacturing a distributed feedback type semiconductor laser comprising a first cladding layer 2, an active layer 3 disposed on said first cladding layer, a guiding layer 4 disposed on said active layer and a second cladding layer 7 disposed on said guiding layer respectively, in which a grating 8 is disposed to said guide layer, wherein the method comprises the steps of:

forming a predetermined material layer on said guide layer, selectively etching said material layer and said guide layer until said guide layer is at least partially exposed thereby forming undulation substantially in a trigonal waveform to the surface of said material layer and said guiding layer, and forming said second cladding layer so as to cover said unevenness.

2. The method set forth in claim 1 wherein the undulation portion formed in said material layer is at least partially removed prior to forming said second cladding layer.

* * * * *